(12) United States Patent
Yang et al.

(10) Patent No.: US 9,425,209 B1
(45) Date of Patent: Aug. 23, 2016

(54) MULTILAYER 3-D STRUCTURE WITH MIRROR IMAGE LANDING REGIONS

(71) Applicant: MACRONIX INTERNATIONAL CO., LTD., Hsinchu (TW)

(72) Inventors: Chin-Cheng Yang, Kaohsiung (TW); Lo-Yuen Lin, Hsinchu (TW); Yu-Wei Jiang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/846,262

(22) Filed: Sep. 4, 2015

(51) Int. Cl.
*H01L 29/76* (2006.01)
*H01L 27/115* (2006.01)
*H01L 29/788* (2006.01)
*H01L 23/528* (2006.01)
*H01L 29/792* (2006.01)

(52) U.S. Cl.
CPC ........ *H01L 27/11582* (2013.01); *H01L 23/528* (2013.01); *H01L 27/11519* (2013.01); *H01L 27/11521* (2013.01); *H01L 27/11556* (2013.01); *H01L 27/11565* (2013.01); *H01L 27/11568* (2013.01); *H01L 29/7889* (2013.01); *H01L 29/7926* (2013.01)

(58) Field of Classification Search
CPC .................. H01L 27/11578; H01L 27/11573; H01L 27/11519; H01L 27/11521; H01L 23/528
USPC .......................................................... 257/314
See application file for complete search history.

(56) References Cited

U.S. PATENT DOCUMENTS

| | | | |
|---|---|---|---|
| 5,218,471 A | 6/1993 | Swanson et al. | |
| 6,323,117 B1 | 11/2001 | Noguchi | |
| 8,383,512 B2 | 2/2013 | Chen et al. | |
| 8,736,069 B2 | 5/2014 | Chiu et al. | |
| 2002/0106823 A1 | 8/2002 | Hwang et al. | |
| 2004/0023499 A1 | 2/2004 | Hellig et al. | |
| 2007/0140001 A1 | 6/2007 | Motoi et al. | |
| 2009/0184360 A1* | 7/2009 | Jin | H01L 21/28273 257/319 |
| 2009/0310415 A1 | 12/2009 | Jin et al. | |
| 2010/0007001 A1 | 1/2010 | Wang et al. | |
| 2011/0018051 A1* | 1/2011 | Kim | H01L 27/11575 257/324 |
| 2011/0031630 A1 | 2/2011 | Hashimoto | |
| 2011/0057321 A1 | 3/2011 | Wang et al. | |
| 2013/0082341 A1 | 4/2013 | Shimizu et al. | |
| 2013/0341797 A1 | 12/2013 | Lim | |
| 2014/0264934 A1 | 9/2014 | Chen | |

* cited by examiner

*Primary Examiner* — Theresa T Doan
(74) *Attorney, Agent, or Firm* — James F. Hann; Haynes Beffel & Wolfeld LLP

(57) ABSTRACT

An integrated circuit includes blocks and global lines overlying the blocks. The blocks include a plurality of levels including two dimensional arrays of memory cells having horizontal lines and being intersected by vertical lines coupled to corresponding memory cells. Levels include contact pads communicating with horizontal lines for a given block. The global lines include connectors. Connectors coupled to given global lines are coupled to landing areas on corresponding contact pads of the blocks. The blocks include first and second blocks disposed so that a first set of the contact pads associated with the first block are next to a second set of contact pads associated with the second block. The landing areas of the contact pads of the first and second blocks are mirror image surfaces of one another. The horizontal lines can be bit lines and the vertical lines can be word lines.

20 Claims, 12 Drawing Sheets

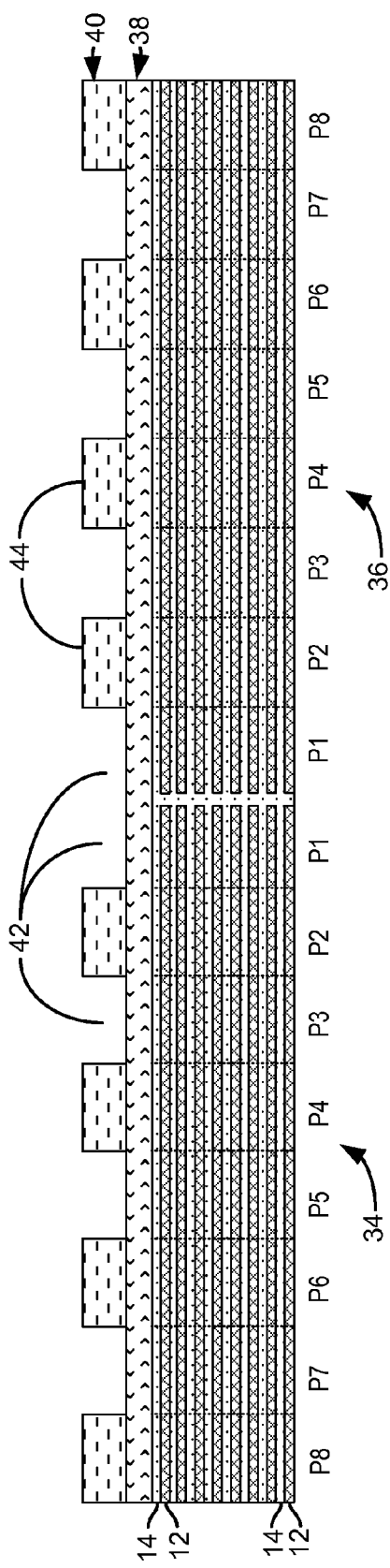
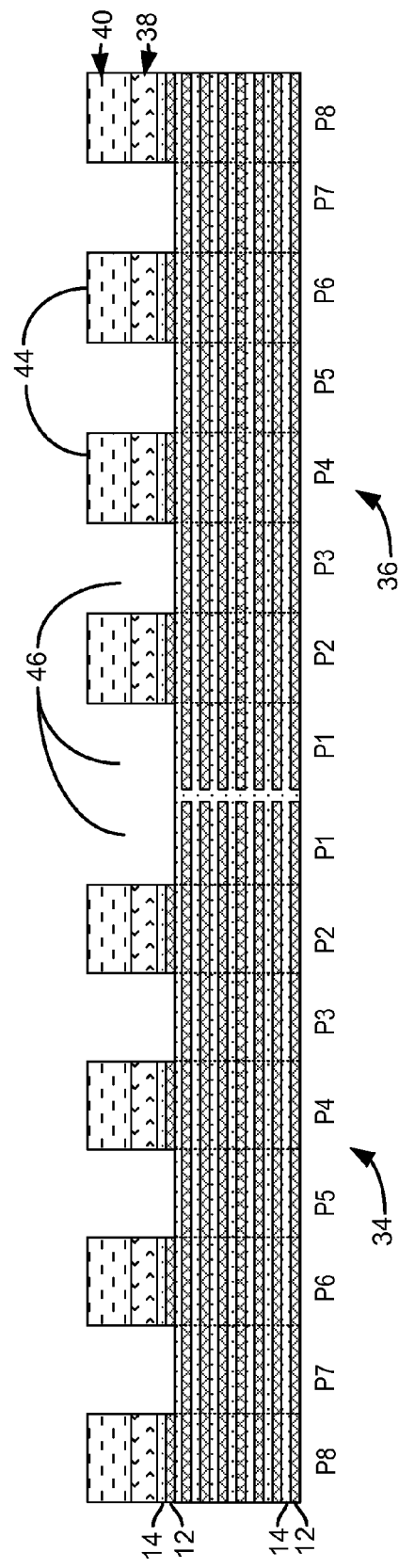
FIG. 2
FIG. 3

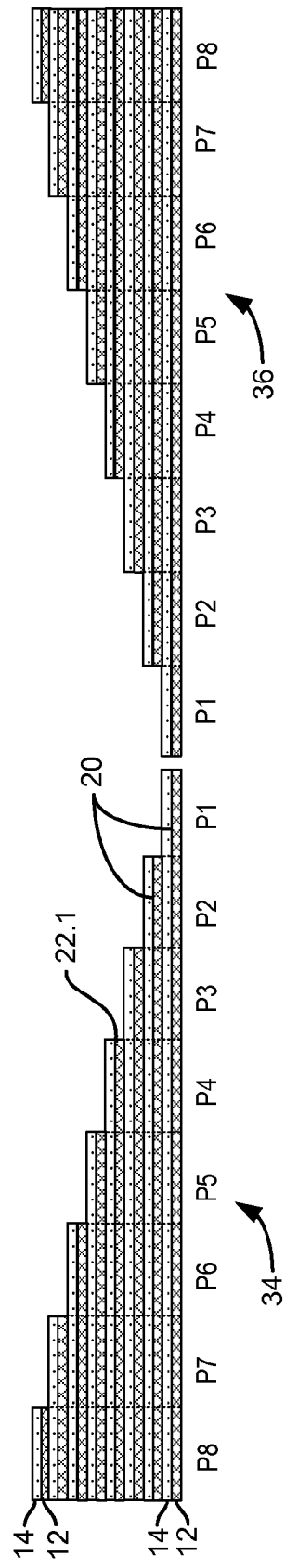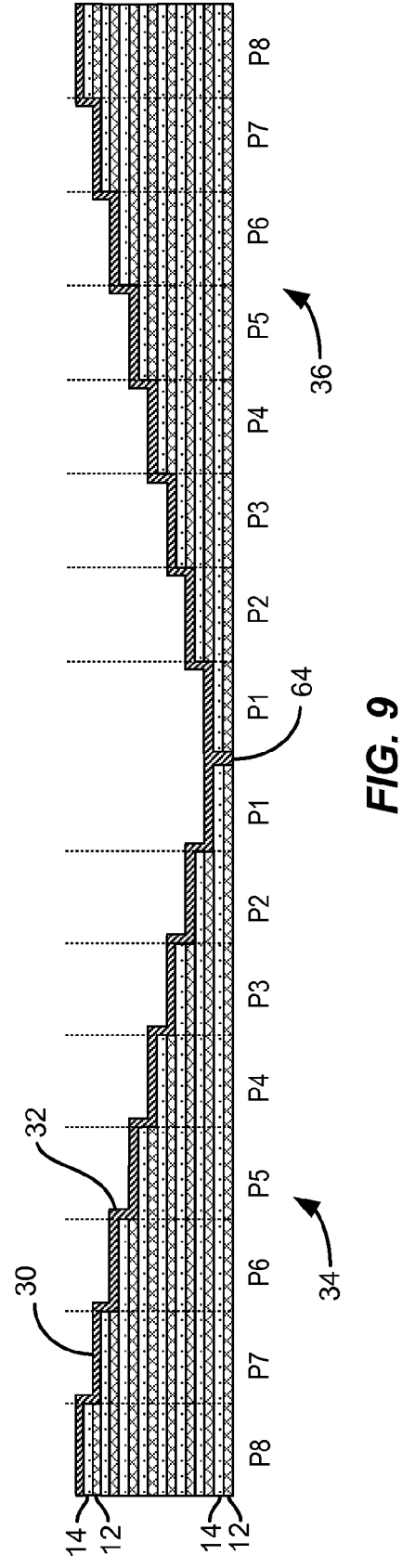
FIG. 8
FIG. 9

MULTILAYER 3-D STRUCTURE WITH MIRROR IMAGE LANDING REGIONS

BACKGROUND

1. Field of the Invention

The present invention relates to three-dimensional (3-D) integrated circuits, and in particular to increasing the processing window for interlayer conductors contacting landing regions of active layers.

2. Description of Related Art

3-D integrated circuits include multiple active layers in which conductive or semiconductive elements are disposed. 3-D memory integrated circuits include stacks of two-dimensional arrays of memory cells. Active layers in the stacks can include bit lines or word lines for example, which must be connected to peripheral circuits like decoders, sense amplifiers and the like. In some arrangements, the connections are made using interlayer conductors that extend from each active layer to a routing layer, such as a patterned metal layer that overlies the stacks of two-dimensional arrays. The patterned metal layer can be used to route signals and bias voltages between the arrays and the appropriate peripheral circuits. Similar signal routing structures can be used on other types of 3-D integrated circuits.

3-D integrated circuits also include other types of structures including 3-D vertical gate structures and 3-D vertical channel structures. Both of these stacks have alternating active layers and insulating layers with interlayer conductors extending to landing regions, also referred to as landing pads, on the various active layers.

The interlayer conductors have lengths that vary in dependence on the active layer to which contact is made. As the number of active layers increases, some of the processes involved in formation of interlayer conductors can become more difficult. One reason for the difficulty is that as the length of the interlayer conductor increases, the interlayer conductor tapers to a smaller diametrical dimension so that the landing window between the interlayer conductor and the landing region on the active layer decrease.

SUMMARY

An integrated circuit includes blocks and global lines overlying the blocks. The blocks include a plurality of levels including respective two dimensional arrays of memory cells having horizontal lines and being intersected by vertical lines coupled to corresponding memory cells in the array. Levels in a given block include corresponding contact pads in electrical communication with the horizontal lines for the given block. The global lines include connectors. Connectors coupled to given global lines are coupled to landing areas on corresponding contact pads of the blocks. The blocks include first and second blocks disposed so that a first set of the contact pads associated with the first block are next to a second set of contact pads associated with the second block. The landing areas of the contact pads of the first and second blocks are mirror image surfaces of one another.

Examples of the integrated circuit can include one or more the following. The horizontal lines can be bit lines and the vertical lines can be word lines. There can be N levels L(z) (level index z=1 to N) in each of the blocks; the connectors can be arranged for global lines in the global lines such that the level indexes for the levels L(z) of the first set of contact pads associated with the first block change in a stepped fashion toward the corresponding contact pads in the second set of contact pads from a first level to a second level; the level indexes for the levels L(z) of the second set of contact pads associated with the second block can change in a stepped fashion toward the corresponding contact pads in the first set of contact pads from the first level to the second level; in addition, the connectors contacting the contact pads at the first level for each of the first and second blocks can be adjacent to one another with no other connectors therebetween. The first and second sets of contact pads can be in a generally V-shaped arrangement. The arrays of memory cells can comprise NAND arrays, and the horizontal lines can comprise local bit lines.

A 3-D structure includes a substrate and first and second units of alternating levels of insulating layers and active layers over the substrate. The first unit includes active layers 1 through n with active layer 1 of the first unit being at a chosen level. The second unit includes active layers 1 through n with active layer 1 of the second unit being at the chosen level. Each of the first and second units includes a stair step arrangement of landing regions on active layers. The landing regions of the first and second units are mirror image surfaces of one another. An insulating layer is over the landing regions. Interlayer conductors pass through the insulating layer to the stairstep arrangements of landing regions for the first and second units and make electrical contact with a plurality of landing regions of each unit.

Examples of the 3-D structure can include following. A plurality of blocks, with blocks in the plurality of blocks comprising a plurality of levels L(z) corresponding to active layers 1 through n, levels L(z) including respective two dimensional arrays of memory cells. Respective two dimensional arrays include horizontal lines, the horizontal lines being a chosen one of bit lines or word lines, and being intersected by vertical lines coupled to corresponding memory cells in the array. The vertical lines are the nonchosen one of the bit lines or word lines. Levels are connected to the landing regions of the corresponding active layers so that the landing regions are in electrical communication with the horizontal lines for a given block.

Examples of the 3-D structure can also include one or more the following. Insulating sleeves can separate the interlayer conductors from the insulating layer. Interlayer conductors can make electrical contact with each of the landing regions of each unit. The mirror image surfaces can create a generally V-shaped surface. The interlayer conductors contacting the landing regions of the first and second units can be opposite one another with no other interlayer conductors therebetween. The mirror image surfaces can create an inverted, generally V-shaped surface.

Other aspects and advantages of the technology described herein can be seen on review of the drawings, the detailed description and the claims, which follow.

BRIEF DESCRIPTION OF THE DRAWINGS

FIGS. 2-11 illustrate an example of process steps for forming the 3-D structure of FIG. 1.

FIG. 2 is a cross-sectional view of a stack of alternating active and insulating layers forming a first stack electrically isolated from a second stack with first and second photoresist layers, and shown after a first etch.

FIG. 3 shows the structure of FIG. 2 following a second etch.

FIG. 4 shows the structure of FIG. 3 following the further deposition of photoresist material to create a re-deposited first photoresist layer and a re-deposited second photoresist layer.

FIG. 5 shows the structure of FIG. 4 following a third etch.

FIG. 6 shows the structure of FIG. 5 following the further deposition of photoresist material to create a second re-deposited first photoresist layer and a second re-deposited second photoresist layer.

FIG. 7 shows the structure of FIG. 6 following a fourth etch.

FIG. 8 shows the structure of FIG. 7 with the second re-deposited second and first photoresist layers removed.

FIG. 9 shows the structure of FIG. 8 with an etch stop layer applied thereto.

FIG. 10 shows the structure of FIG. 9 with the etch stop layer covered by an insulating layer.

FIG. 11 shows the structure of FIG. 10 after holes have been formed through the insulating layer, the etch stop layer and the uppermost insulating layer with the interlayer conductors extending to and contacting the landing regions of the contact pads for the active layers of each stairstep unit.

DETAILED DESCRIPTION

Figure 1:
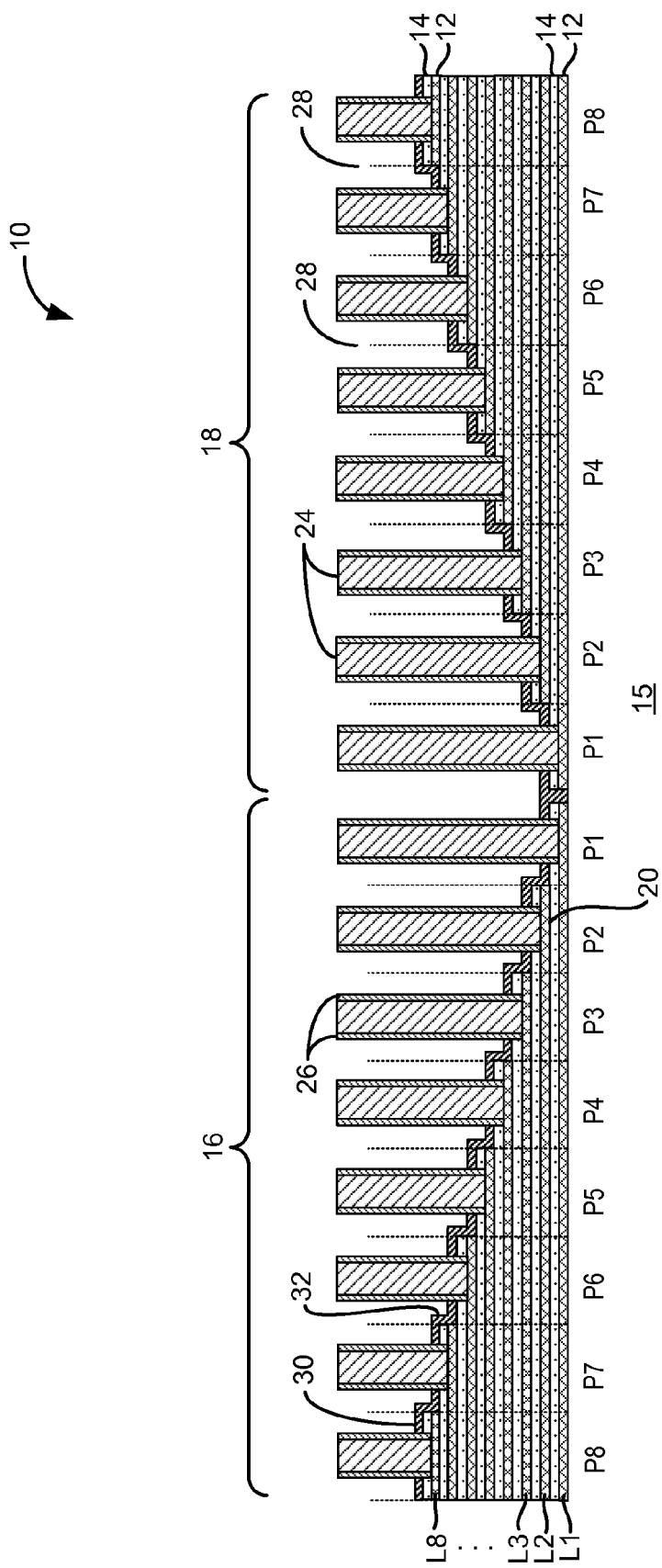
FIG. 1 is a simplified cross-sectional view of a 3-D structure having alternating active and insulating layers, and first and second stairstep units.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals. Also, unless otherwise specified, the terms insulators and conductors refer to electrical insulators having a bulk electrical resistivities of at least $10^6$ ohm-cm, preferably at least $10^8$ ohm-cm and more preferably at least $10^{12}$ ohm-cm, and to electrical conductors having a bulk electrical resistivities of $10^{-6}$ to 1 ohm-cm.

Figure 1A:
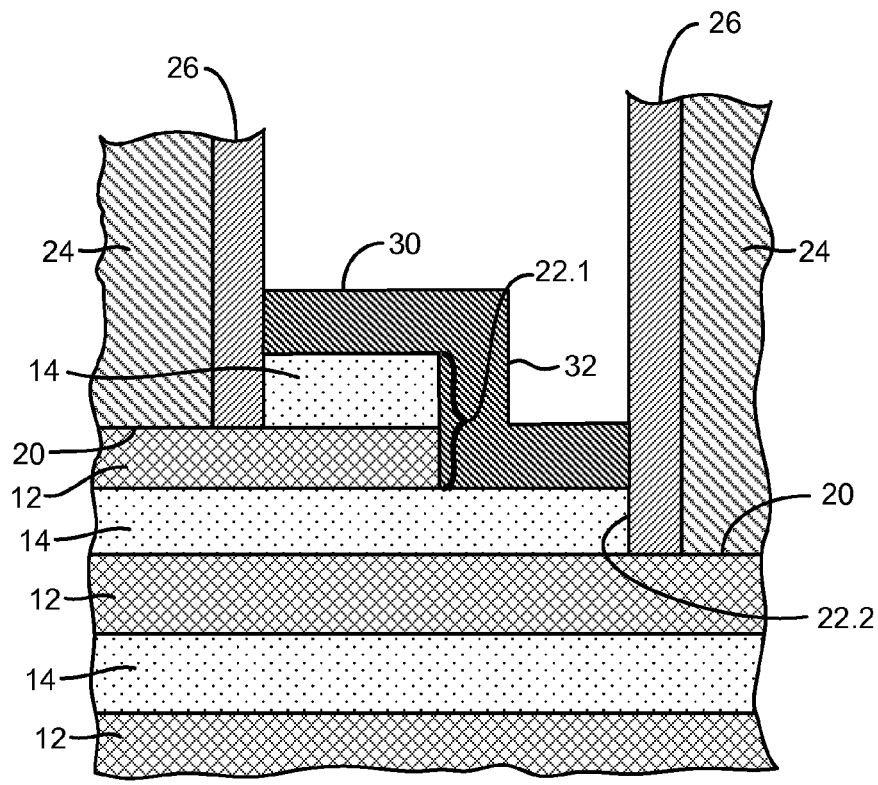
FIG. 1A is an enlarged view of a portion of the structure of FIG. 1.

FIG. 1 is a simplified cross-sectional view of a 3-D structure 10 having a plurality of levels, identified as levels L1-L8 in the figure, with alternating active layers 12 and insulating layers 14 over a substrate 15. The stacks of alternating active and insulating layers 12, 14 form first and second stairstep units 16, 18 which are mirror images of one another. Stairstep units 16, 18 are stairstep arrangements of landing regions 20 on contact pads of the active layers 12, and of side surfaces 22.1 and 22.2, see FIG. 1A, extending from the landing regions for positions P1-P7. Side surfaces 22.1 and 22.2, collectively referred to as side surfaces 22, are formed by the edges of active and insulating layers 12, 14 adjacent to landing regions 20. The landing regions 20 are at positions P1-P8 for each stairstep unit 18. In some examples the positions of active and insulating layers 12, 14 can be reversed so that in that example only side surfaces corresponding to side surfaces 22.1 would be created. Active layers 12 are electrically conductive layers made of semiconductive materials, conductive materials, or combinations of the thereof, and are distinguished from insulating layers in that the active layers carry voltage and current for mission functions of the device, while the insulating layers separate the active layers from one another. In this example active layers 12 are made of patterned polysilicon layers with doping patterns suitable for the memory structures implemented. Insulating layers 14 are electrically insulating layers, made of, in this example, silicon dioxide $SiO_2$. Other electrically insulating materials such as silicon nitride, silicon oxynitride, and other materials that can operate as interlayer dielectrics can also be used for insulating layers 14.

Interlayer conductors 24, surrounded by insulating sleeves 26, pass through insulating layer 28 to contact active layers 12 at landing region 20 for each position P1-P8 for each stairstep unit 16, 18. An etch stop layer 30 overlies landing regions 28 and side surfaces 22 except for the portions of landing regions 20 occupied by interlayer conductors 24 and insulating sleeves 26. Interlayer conductors 24 are of electrically conductive materials.

In this example interlayer conductors 24 are doped polysilicon (using dopants such as As, P, B). However, other electrically conductive materials such as other doped semiconductors, metal, conductive metal compounds such as silicides, and combinations of such materials, can also be used.

Insulating sleeves 26 are made of electrically insulating material, such as SiN in this example, and can be the same material as, or a different material than, that used as the insulating layers.

Etch stop layer 30 is an electrically insulating material chosen for etching characteristics that differ from the characteristics of the insulating layer. In one example of the etch stop layer 30 can be silicon nitride, such as for use with a silicon oxide based electrically insulating layer 28. Other materials such as SiON can also be used for etch stop layer 30.

Figure 1B:
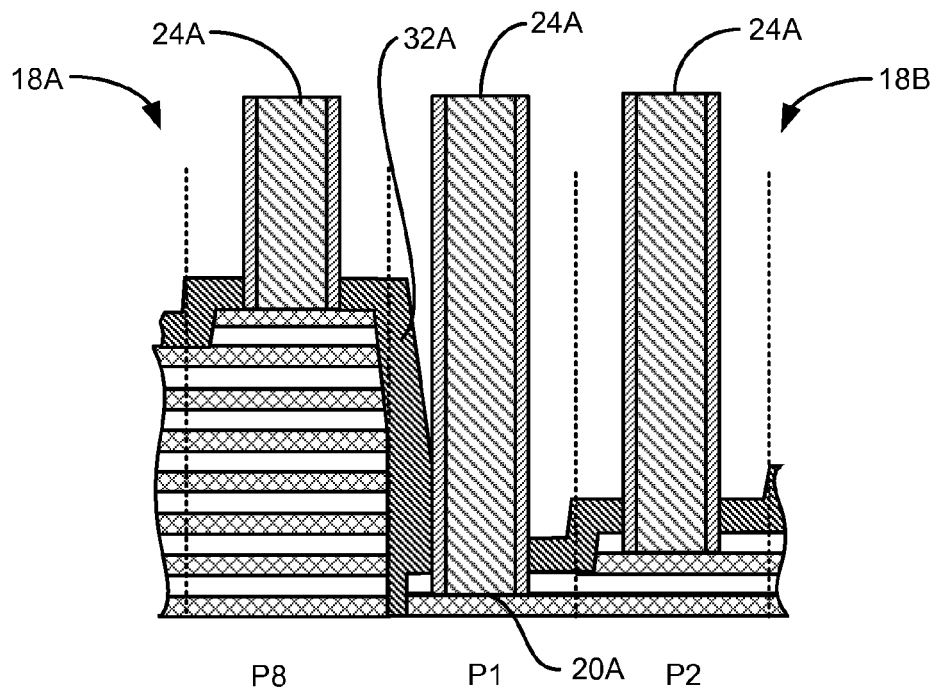
FIG. 1B is a simplified cross-sectional view of a portion of a 3-D structure illustrates a problem created when adjacent stairstep units do not have mirror image symmetry.

FIG. 1B illustrates a problem created when adjacent stairstep units, such as stairstep units 18A and 18B, do not have mirror image symmetry. In the example of FIG. 1B, the etch stop sidewalls 32 at most positions P2-P8 are relatively short and do not affect the contact landing window onto landing regions 20 for interlayer conductors 24 in any significant amount. However, the etch stop sidewall 32A located between positions P8 of stairstep unit 18B and position P1 of stairstep unit 18A, and therefore adjacent to the interlayer conductor 24A of stairstep unit 18A, necessarily has a tapered profile due to its height. The thickness of etch stop sidewall 32A increases as it approaches the landing region 20A at position P1. The tapered profile of etch stop sidewall 32A therefore decreases the contact landing window for the interlayer conductor 24A at position P1 of second staircase unit 18B.

Landing regions 20 for the mirror image first and second stairstep unit 16, 18 have a generally V-shape. That is, a line (not illustrated) passing through the center of each landing region 20 for first stairstep unit 16 and for second stairstep unit 18 would have, in this example, a wide, low angle V-shape. While in the disclosed example the lines passing through the centers of landing regions 20 are single straight lines for each stairstep unit 16, 18, each stairstep unit could define a set of straight lines, or a single curved line, or a set of curved lines, or a combination of straight and curved lines. Accordingly, generally V-shaped mirror image stairstep units include stairstep units having other mirror image shapes, including, for example, a narrower, higher angle V-shape, and what could be described as generally U-shaped when the lines passing through the center of landing regions 20 closer to substrate 15 are curved.

Figure 1C:
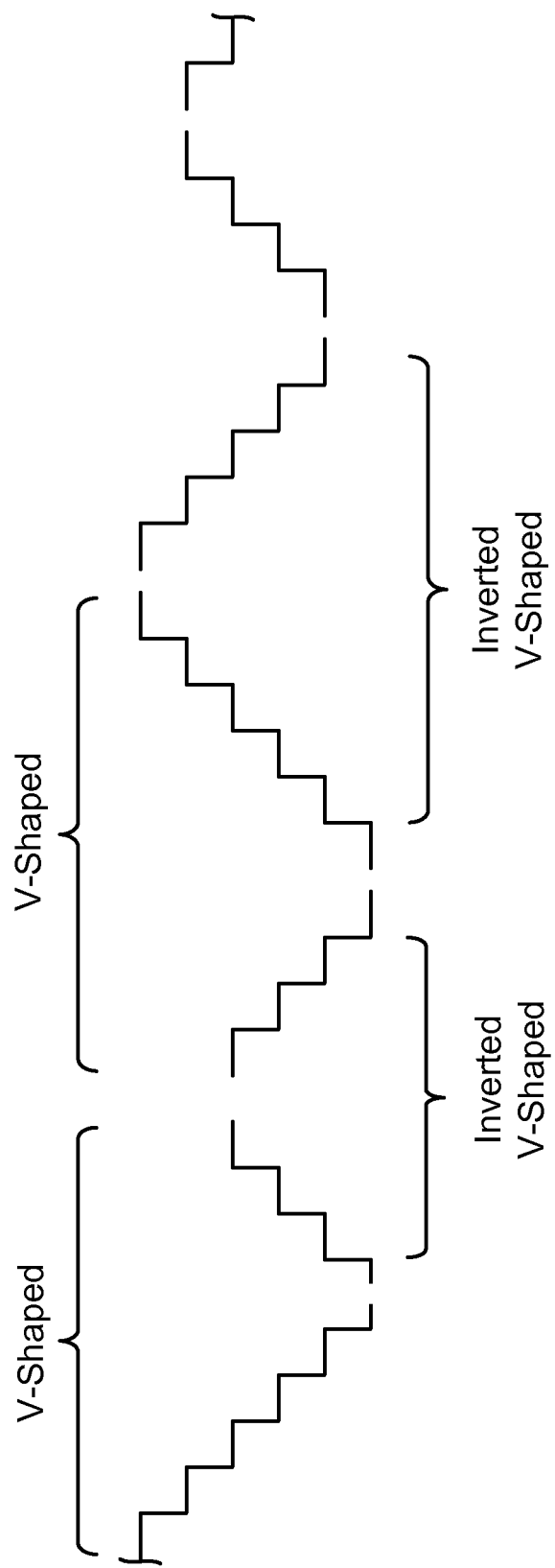
FIG. 1C is a simplified representation illustrating V-shaped stairstep units and inverted V-shaped stairstep units.

FIG. 1C illustrates V-shaped stairstep units and inverted V-shaped stairstep units. Both the V-shaped and inverted V-shaped stairstep units provide the advantage of eliminating the need to form an opening for the passage of interlayer conductor 24, surrounded by insulating sleeves 26 adjacent to a tall, tapered etch stop sidewall, such as illustrated as sidewall 32A in FIG. 1B. That is, the size of the landing window for the adjacent interlayer conductors 24 of adjacent stairstep units is not reduced as occurs at position P1 for interlayer conductor 24A of staircase unit 18A. FIG. 1C also illustrates situations in which adjacent stairstep units do not have the same number of landing regions.

FIGS. 2-11 illustrate an example of process steps for forming the 3-D structure of FIG. 1.

FIG. 2 is a cross-sectional view of first and second stacks 34, 36 of alternating active and insulating layers 12, 14. A first photoresist layer 38 covers the first and second stacks 34, 36. A second photoresist layer 40 is formed over first photoresist layer 38. In this example second photoresist layer 40 is etched to create first open regions 42 between second photoresist layer elements 44. First open regions 42 and second photoresist layer elements 44 for stacks 34, 36 are mirror images of one another. The first open regions 42 are at positions P1, P3, P5 and P7 for both stacks 34, 36.

FIG. 3 shows the structure of FIG. 2 following a second etch through the first open regions 42 creating extended first open regions 46 by etching through first photoresist layer 38. This first stack etching step also removes $2^{n-1}$ insulating layers 14 and active layers 12 where n=1 because it is the first stack etching step. Therefore, the first stack etching step removes $2^0=1$ insulating layer 14 and 1 active layer 12, that is the uppermost active and insulating layers of the first and second stacks 34, 36.

Figure 4:
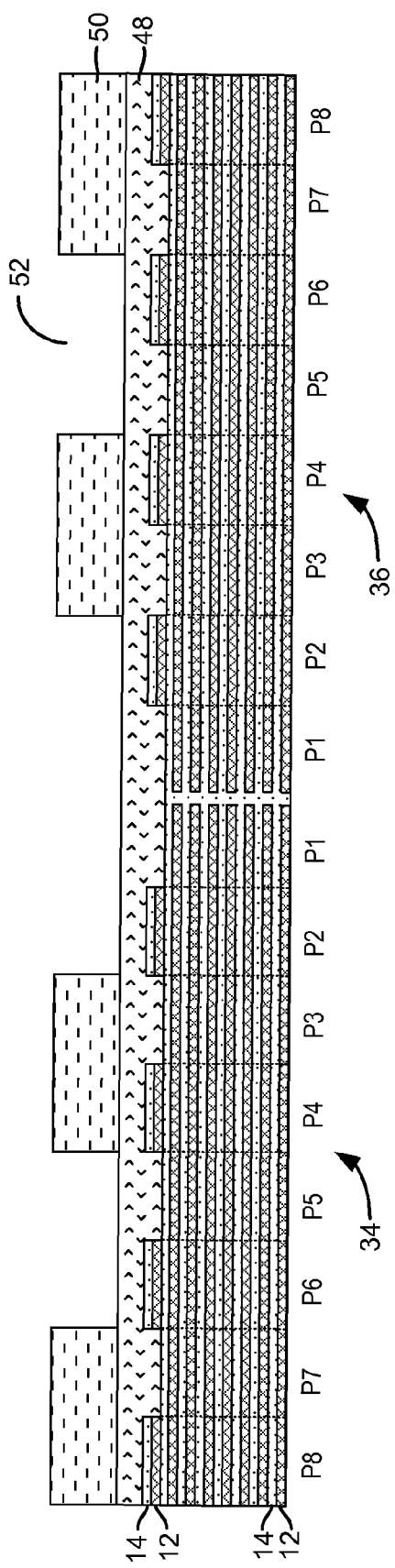

In FIG. 4 the structure of FIG. 3 as shown following the further deposition of photoresist material to create a re-deposited first photoresist layer 48, followed by further deposition of photoresist material to create a re-deposited second photoresist layer 50. The re-deposited second photoresist layer 50 is shown following a second, mirror image etch on the re-deposited second photoresist layer 50 creating second open regions 52 down to the re-deposited first photoresist layer 48. The second open regions 52 cover positions P1, P2, P5 and P6 for each stack 34, 36.

Figure 5:
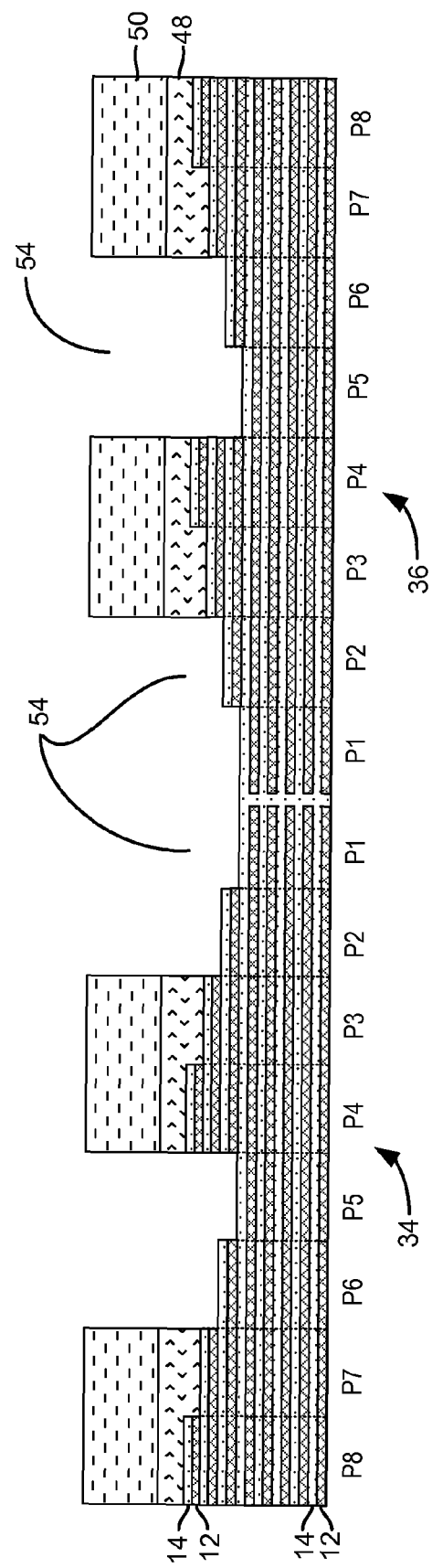

FIG. 5 shows the structure of FIG. 4 following a third etch which is creates extended second open regions 54 etching through $2^{n-1}=2^1=2$ additional insulating layers 14 and active layers 12 at positions P1 and P5 for stacks 34, 36. This etching step also etches the 2 uppermost insulating and active layers 14, 12 at positions P2 and P6 for each stack 34, 36.

Figure 6:
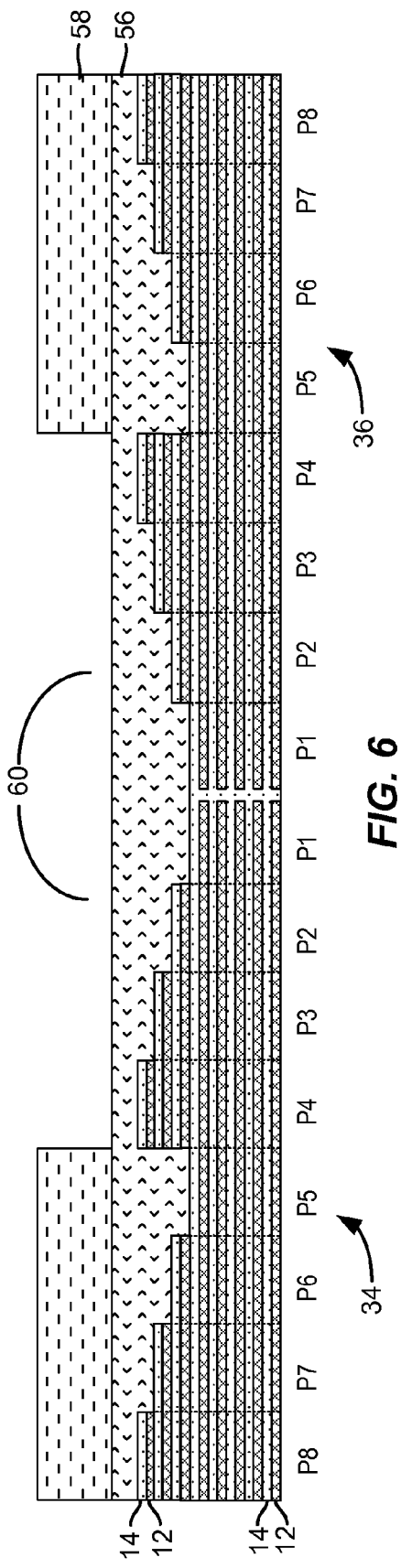

The structure of FIG. 5 is shown in FIG. 6 following the further deposition of photoresist material to create a second re-deposited first photoresist layer 56, followed by further deposition of photoresist material to create a second re-deposited second photoresist layer 58. The second re-deposited second photoresist layer 58 is shown following a third, mirror image etch of the second re-deposited second photoresist layer 58 creating third open regions 60 down to the second re-deposited first photoresist layer 56. The third open regions 66 cover positions P1, P2, P3 and P4 for each stairstep unit.

Figure 7:
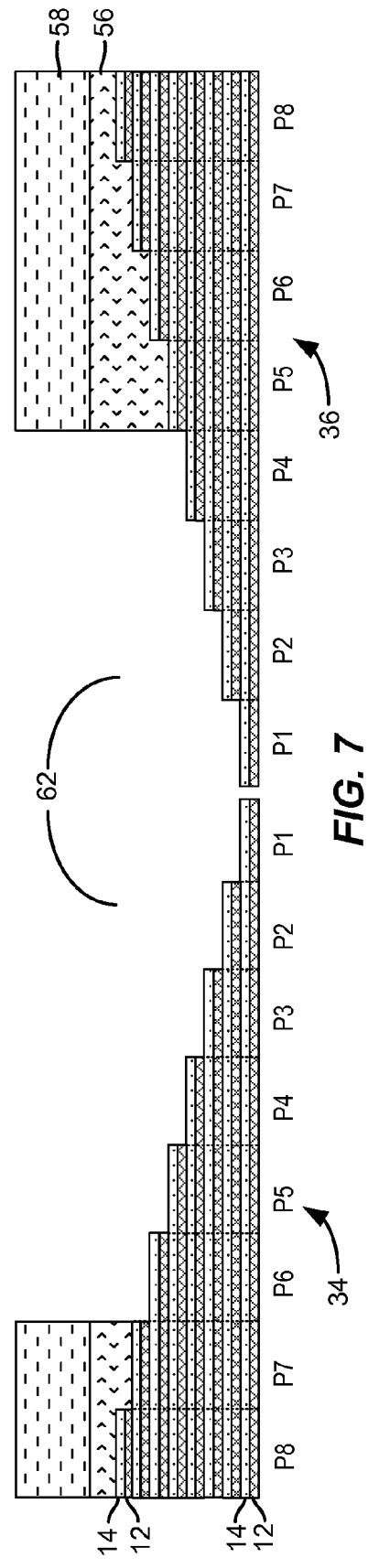

FIG. 7 shows the structure of FIG. 6 following a fourth etch which creates extended third open regions 62, and for each stack 34, 36 etching through the $2^{n-1}=2^{3-1}=2^2=4$ uppermost active layers and insulating layers at position P4, and etching through 4 additional active and insulating layers at positions P1, P2, and P3.

Figure 10:
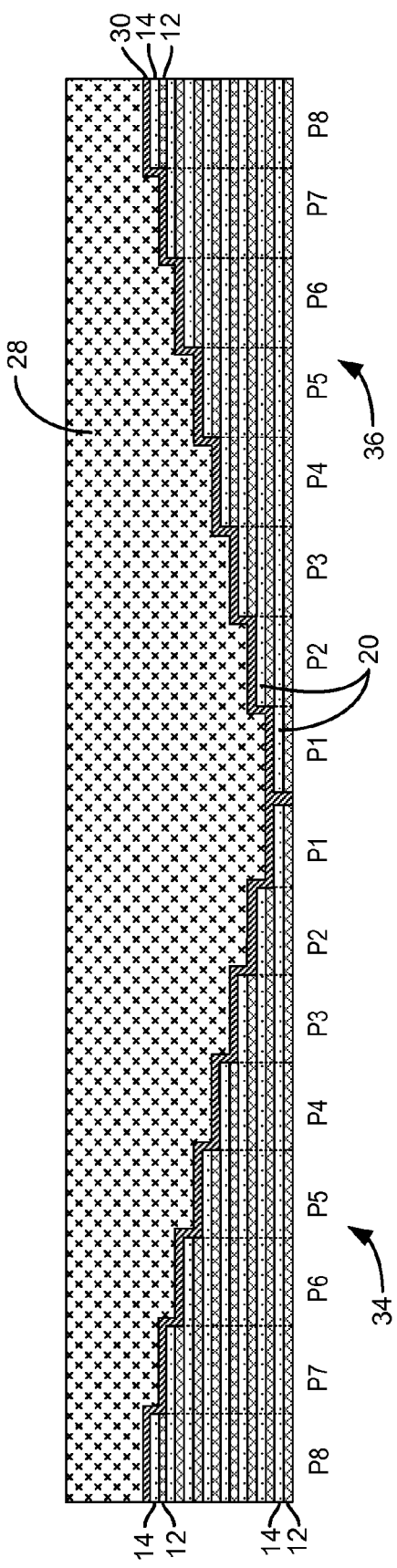

FIG. 8 shows the structure of FIG. 7 with the second re-deposited second photoresist layer 58 and the second re-deposited first photoresist layer 56 removed. Doing so exposes landing regions 20 on active layers 12 at each position P1-P8 for each stack 34, 36. In addition, side surfaces 22.1 extending from the landing regions 20 are also exposed. FIG. 9 shows the structure of FIG. 8 with etch stop layer 30 over the landing regions 20 and side surfaces 22.1 and also at location 64 between the active and insulating layers 12, 14 for opposing positions P1 of the stacks 34, 36. In FIG. 10 the structure of FIG. 9 is shown with etch stop layer 30 covered by insulating layer 28.

Figure 11:
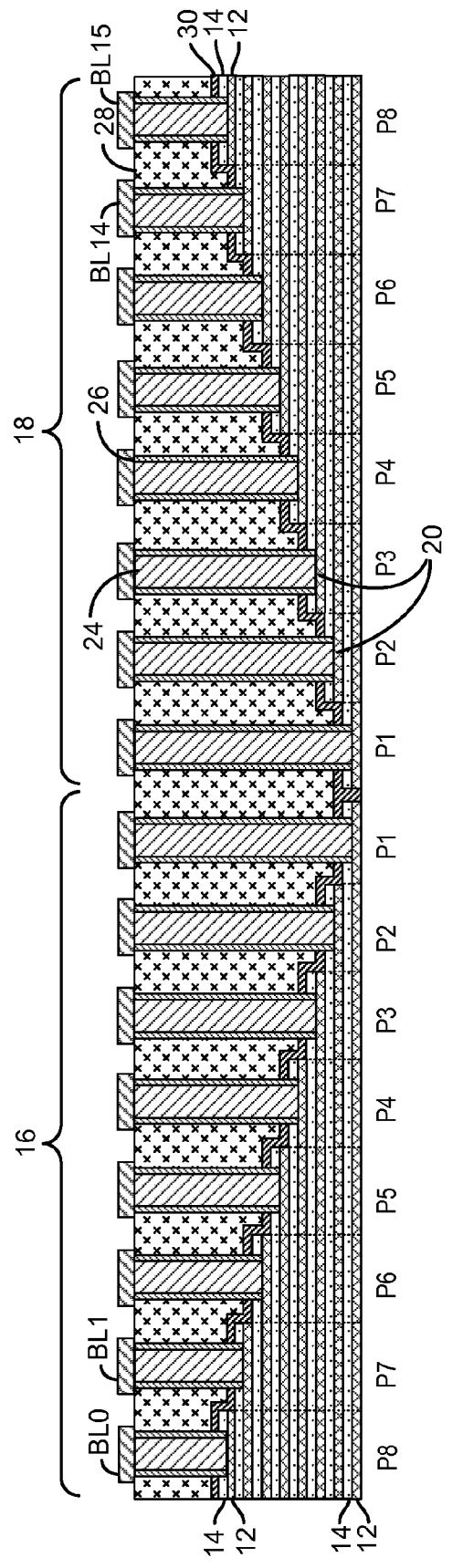

FIG. 11 shows the structure of FIG. 10 after holes have been formed through the insulating layer 28, through the etch stop layer 30, and through the uppermost insulating layer 14 at each position P1-P8 for each stack 34, 36. Insulating sleeves 26 are shown surrounding interlayer conductors 24 within each hole. Interlayer conductors 24 extend to and contact the landing region 20 of the active layer 12 at each position P1-P8 for each stairstep unit 16, 18. Formed on the top of interlayer conductors 24 are global bit lines BL0-BL15.

Figure 12:
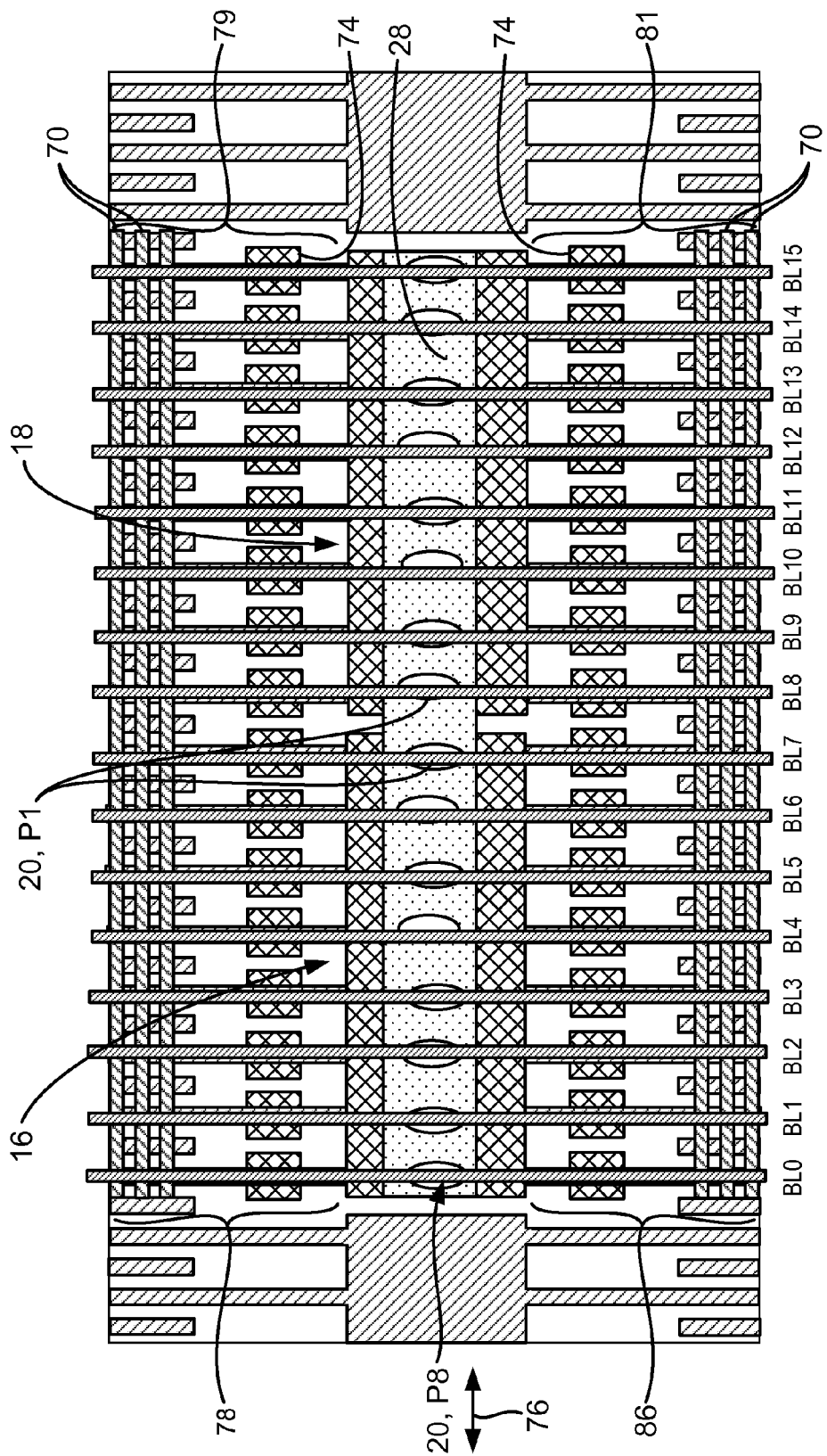
FIG. 12 is a somewhat schematic top view representation of a 3-D memory structure including first and second stairstep units similar to that of the 3-D structure of FIG. 1.
Figure 12A:
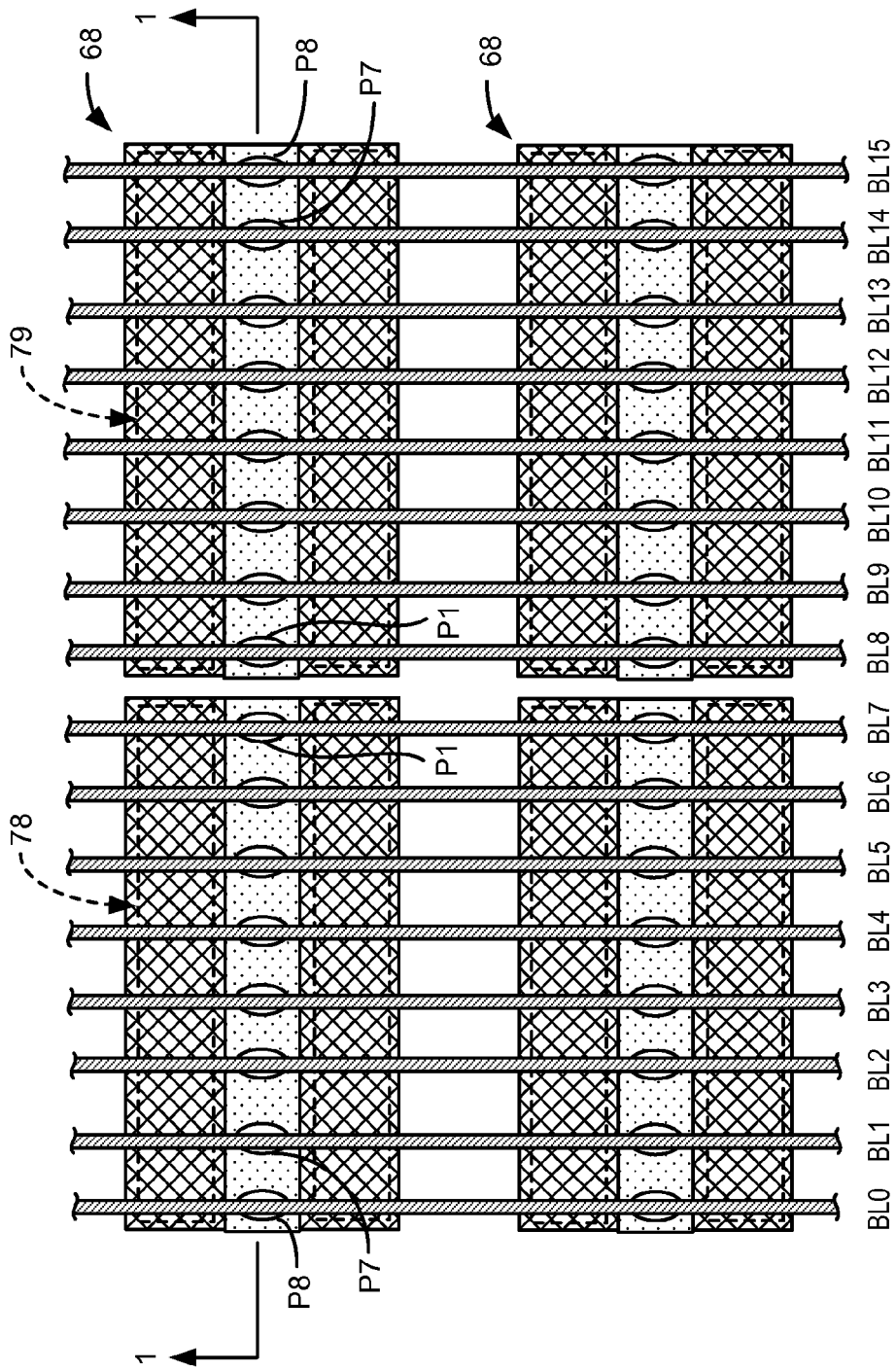
FIG. 12A illustrates an exemplary simplified layout view duplicating the 3-D memory structure of FIG. 12 illustrating how the global bit lines can connect adjacent 3-D memory structures so to provide access to blocks of transistors/memory devices on each side of the stairstep units for different 3-D memory structures.

FIG. 12 is a somewhat schematic top view representation of a 3-D memory structure 68, including first and second stairstep units similar to that of the structure of FIGS. 1 and 11, together with some associated circuitry. FIG. 12A illustrates an exemplary simplified layout view duplicating the 3-D memory structure 68 of FIG. 12. While the layout of FIG. 12 illustrates a 3-D vertical gate structure, the technology discussed herein can also be used for other architecture, such as 3-D vertical channel structure. FIG. 12 illustrates first and second stairstep units 16, 18 positioned along a first direction 76 with landing regions 20 at positions P1-P8. Global bit lines B01-B15 overlie landing regions 20 and electrically connect with the interlayer conductors 24 extending from each landing region 20. Global bit lines B01-B15, also referred to as global lines, correspond to the global lines at metal layer ML3 of FIG. 13.

Figure 13:
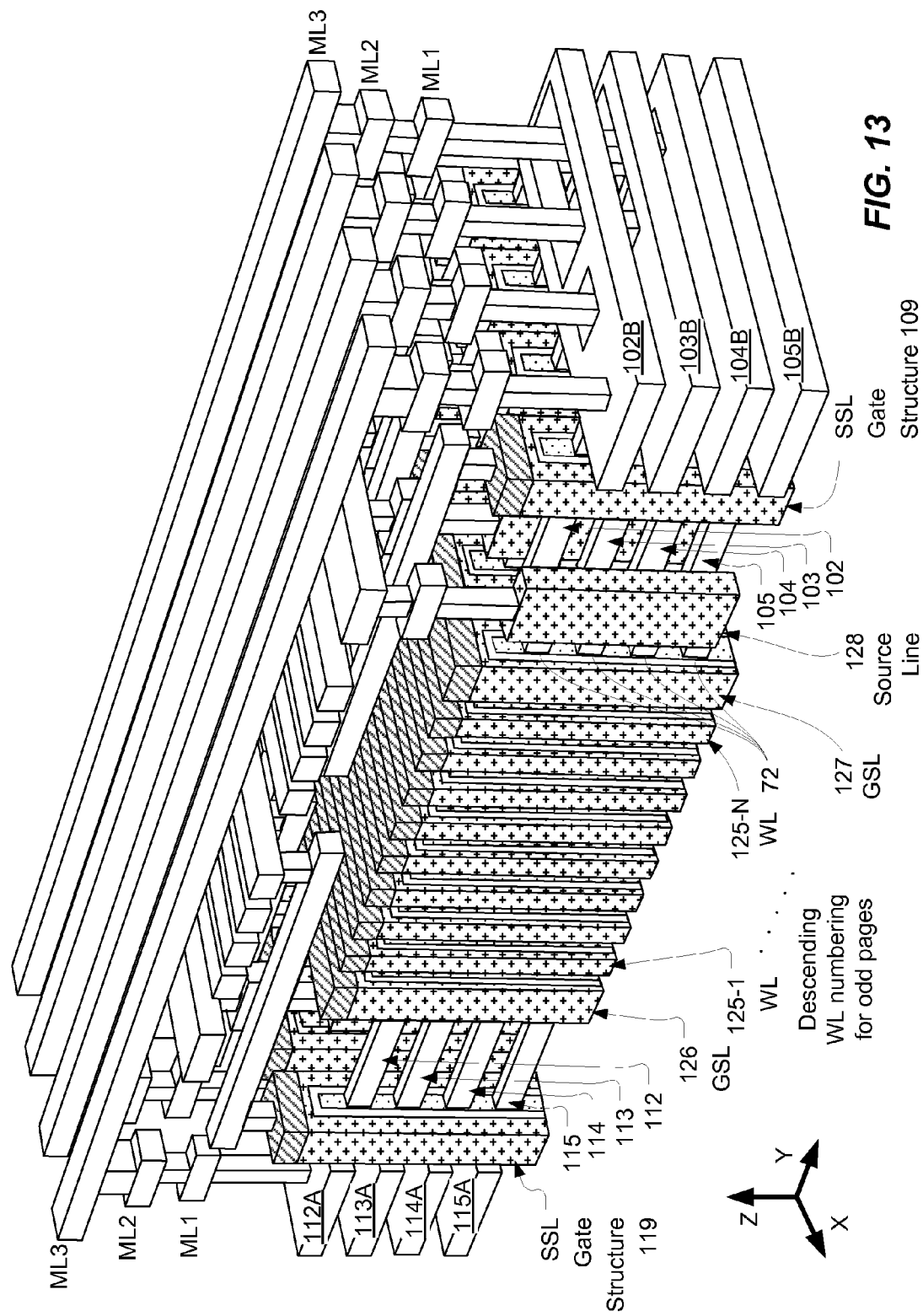
FIG. 13 is a perspective illustration of a 3D NAND memory array structure. Insulating material is removed from the drawing to expose additional structure for illustrative purposes.

Also illustrated in FIG. 12 are string select line gates 74, which correspond to SSL Gate Structure 109 of FIG. 13. SSL Gate Structures 109 are coupled to stacks of vertical gate transistors 72 at gate select line 127 as well as stacks of vertical gate transistors/memory cells 73 at word lines 125; in this example word lines 125 can be referred to as vertical lines. This connection is shown in FIG. 13 through conductors such as semiconductor strips 112-115 and 102-105. Semiconductor strips 112-115 and 102-105 act as horizontal lines, in this example horizontal local bit lines. The vertical gate transistors/memory cells 73 for each word line 125 act as two-dimensional arrays of memory cells 73.

First and second blocks 78, 79 of string select line gates 74 and their associated stacks of transistors/memory cells 73, see also FIG. 12A, are located adjacent to one another on one side of the first and second stairstep units 16, 18; third and fourth blocks 80, 81 of string select line gates 74 and their associated stacks of vertical gate transistors 73 are located adjacent to one another on the other side of first and second stairstep units 16, 18.

Word lines 70 of FIG. 12 are horizontal lines extending perpendicular to global bit lines BL0-BL15 for electrical connection to transistors/memory cells 73 of FIG. 13. Word lines 70 correspond to conductive structure 84 overlying the horizontally extending series of vertically extending word lines 125 shown in FIG. 13.

FIG. 12A illustrates how global bit lines BL0-BL15 can connect to adjacent 3-D memory structures 68 so to provide access to blocks of transistors/memory devices 78-81 on each side of the stairstep units 16, 18 for lines of adjacent 3-D memory structure 68. In practice an array of hundreds or thousands of 3-D memory structures 68 are typically created. The cutting plane line 11-11 in FIG. 12A corresponds generally to the cross-sectional view of FIG. 11. In other examples the bit lines can be vertical lines and the word lines can be horizontal lines.

In the illustrated examples blocks 78, 80 and 79, 81 share the landing regions 20 of stairstep unit 16, 18 so that the same landing region can be considered part of more than one block. In other examples the landing regions of a stairstep unit may not be shared so that in that situation the landing region can be considered part of a single block. In addition to adjacent blocks sharing landing regions in one direction, the landing regions can be provided only one end by of a block. In FIGS. 12 and 12A, blocks 78-81 are drawn so they do not encompass landing regions for clarity of illustration. However, the landing regions can be considered part of the blocks on one or both sides of the landing regions.

FIG. 13 is a perspective illustration of a 3D NAND memory array structure which could include structure made according to the technology discussed above. Insulating material is removed from the drawing to expose additional structure for illustrative purposes. For example, insulating layers are removed between the semiconductor strips (e.g. 112-115) in stacks, and are removed between the stacks of semiconductor strips.

The multilayer array is formed on an insulating layer, and includes a plurality of word lines 125-1 WL, . . . , 125-N WL conformal with the plurality of stacks. The plurality of stacks includes semiconductor strips 112, 113, 114, 115. Semiconductor strips in the same plane are electrically coupled to corresponding bit line pad structures (e.g. 102B to 105B and 112A to 115A).

The shown word line numbering, ascending from 1 to N going from the back to the front of the overall structure, applies to even memory pages. For odd memory pages, the word line numbering descends from N to 1 going from the back to the front of the overall structure.

Bit line pad structures 112A, 113A, 114A, 115A terminate semiconductor strips, such as semiconductor strips 112, 113, 114, 115, in each active layer of the structure. As illustrated, these bit line pad structures 112A, 113A, 114A, 115A are electrically connected to different global bit lines in overlying patterned conductor layer (M3) for connection to decoding circuitry to select planes within the array. These bit line pad structures 112A, 113A, 114A, 115A can be patterned at the same time that the plurality of stacks are defined.

Bit line pad structures 102B, 103B, 104B, 105B terminate semiconductor strips, such as semiconductor strips 102, 103, 104, 105. As illustrated, these bit line pad structures 102B, 103B, 104B, 105B are electrically connected to different global bit lines in overlying patterned conductor layer (ML3) for connection to decoding circuitry to select planes within the array, and sense amplifiers and other circuits. These bit line pad structures 102B, 103B, 104B, 105B can be patterned at the same time that the plurality of stacks are defined.

Any given stack of semiconductor strips is coupled to either the bit line pad structures 112A, 113A, 114A, 115A, or the bit line pad structures 102B, 103B, 104B, 105B, but not both. A stack of semiconductor strips has one of the two opposite orientations of bit line end-to-source line end orientation, or source line end-to-bit line end orientation. For example, the stack of semiconductor strips 112, 113, 114, 115 has bit line end-to-source line end orientation; and the stack of semiconductor strips 102, 103, 104, 105 has source line end-to-bit line end orientation. In an alternative, all the strips in one active layer of the block can terminate in the same bit line pad structure.

The stack of semiconductor strips 112, 113, 114, 115 is terminated at one end by the bit line pad structures 112A, 113A, 114A, 115A, passes through SSL gate structure 119, ground select line GSL 126, word lines 125-1 WL through 125-N WL, ground select line GSL 127, and terminated at the other end by source line 128. The stack of semiconductor strips 112, 113, 114, 115 does not reach the bit line pad structures 102B, 103B, 104B, 105B.

The stack of semiconductor strips 102, 103, 104, 105 is terminated at one end by the bit line pad structures 102B, 103B, 104B, 105B, passes through SSL gate structure 109, ground select line GSL 127, word lines 125-N WL through 125-1 WL, ground select line GSL 126, and terminated at the other end by a source line (obscured by other parts of FIG. 13). The stack of semiconductor strips 102, 103, 104, 105 does not reach the bit line pad structures 112A, 113A, 114A, 115A.

A layer of memory material separates the word lines 125-1 WL through 125-N WL, from the semiconductor strips 112-115 and 102-105. Ground select lines GSL 126 and GSL 127 are conformal with the plurality of stacks, similar to the word lines.

Global bit lines and string select lines are formed in patterned conductor layers, such as the metal layers ML1, ML2, and ML3.

Transistors/memory cells 72 are formed at cross points between the semiconductor strips (e.g. 112-115) and the word line 125-1 WL through 125-N WL. In the transistors, the semiconductor strip (e.g. 113) acts as the channel region of the device. The semiconductor strips (e.g. 112-115) can act as the gate dielectric for the transistors.

String select structures (e.g. 119, 109) can be patterned during the same step that the word lines 125-1 WL through 125-N WL are defined. Transistors are formed at cross points between the semiconductor strips (e.g. 112-115) and the string select structures (e.g. 119, 109). These transistors act as string select switches coupled to decoding circuitry for selecting particular stacks in the array.

In an alternative, the active layer is patterned with word lines and the channels can be vertical between the stacks. See, for example, commonly owned U.S. Patent Application Publication No. 2012/0182808, filed 19 Jan. 2011, entitled Memory Device, Manufacturing Method And Operating Method Of The Same, by inventors Hang-Ting Lue and Shi-Hung Chen, which is incorporated by reference as if fully set forth herein.

The 3D memory device shown in FIG. 13 uses finger VG (vertical gates), like commonly owned U.S. Patent Publication No. 2012/0182806, filed Apr. 1, 2011, entitled Memory Architecture of 3D Array With Alternating Memory String Orientation and String Select Structures by inventors Shih-Hung Chen and Hang-Ting Lue. Instead of 3-D vertical gate memory devices, some examples can be used with 3-D vertical channel memory devices such as shown in commonly owned U.S. patent application Ser. No. 14/284,306, filed 21 May 2014, entitled 3D Independent Double Gate Flash Memory by inventor Hang-Ting Lue, the disclosure of which is incorporated by reference.

Various techniques for the connection of interlayer conductors to landing areas on the bit line pad structures use a relatively thick hard mask in processing. One type of thick hard mask uses an organic dielectric layer, ODL, as the hard mask layer. However, to withstand processing from many layers the thickness for the ODL hard mask layer may need to b 2,000 nanometers or more. However, it can be difficult to manufacture such materials using typical spin on processes with thicknesses more that than about 400 nanometers, which may be only a fraction of the thickness needed. Thus multiple application processes may be needed to reach a desired thickness.

Another type of thick hard mask can be made of silicon nitride (SiN). However, stress considerations related to the thickness of SiN can limit its effective maximum thickness for this purpose.

Figure 14:
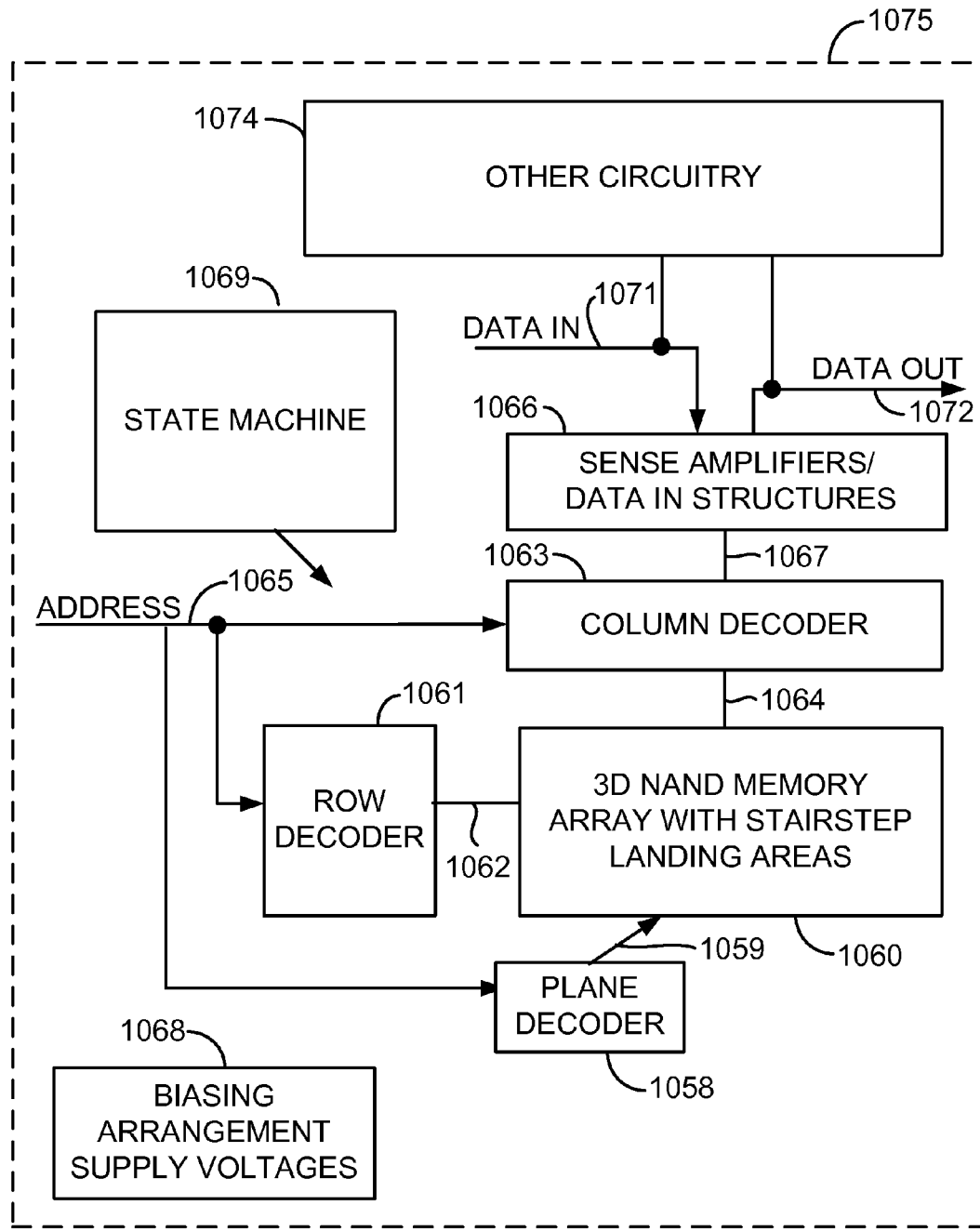
FIG. 14 is a simplified block diagram of an integrated circuit memory employing memory cells and bias circuitry according to embodiments of the present technology.

FIG. 14 is a schematic diagram of a 3-D integrated circuit including a 3D NAND memory array. The integrated circuit 1075 includes a 3D NAND flash memory array on a semiconductor substrate, such substrate 15 of FIG. 1. A row decoder 1061 is coupled to a plurality of word lines 1062, and arranged along rows in the memory array 1060. A column decoder 1063 is coupled to a plurality of SSL lines 1064, including string select line gates 74 shown in FIG. 12, arranged along columns corresponding to stacks in the memory array 1060 for reading and programming data from the memory cells in the array 1060. A plane decoder 1058 is coupled to a plurality of planes in the memory array 1060 via bit lines 1059. Addresses are supplied on bus 1065 to column decoder 1063, row decoder 1061 and plane decoder 1058. Sense amplifiers and data-in structures in block 1066 are coupled to the column decoder 1063 in this example via data bus 1067. Data is supplied via the data-in line 1071 from input/output ports on the integrated circuit 1075 or from other data sources internal or external to the integrated circuit 1075, to the data-in structures in block 1066. In the illustrated embodiment, other circuitry 1074 is included on the integrated circuit, such as a general purpose processor or special purpose application circuitry, or a combination of modules providing system-on-a-chip functionality supported by the NAND flash memory cell array. Data is supplied via the data-out line 1072 from the sense amplifiers in block 1066 to input/output ports on the integrated circuit 1075, or to other data destinations internal or external to the integrated circuit 1075.

A controller implemented in this example using bias arrangement state machine 1069 controls the application of bias arrangement supply voltage generated or provided through the voltage supply or supplies in block 1068, such as read, erase, program, erase verify and program verify voltages.

The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The above descriptions may have used terms such as above, below, top, bottom, over, under, et cetera. These terms may be used in the description and claims to aid understanding of the invention and not used in a limiting sense. When components are stated to be, for example, the same size, to have the same length, or described in a similar manner, the size, length, etc. are considered equal when they are within normal manufacturing tolerances of a nominal length, size, etc. Any and all patent applications and printed publications referred to above are incorporated by reference.

While the present invention is disclosed by reference to the preferred embodiments and examples detailed above, it is to be understood that these examples are intended in an illustrative rather than in a limiting sense. While the present technology has been described with reference to memory applications, it may also be applied to other stacked layer structures. It is contemplated that modifications and combinations will occur to those skilled in the art, which modifications and combinations will be within the spirit of the invention and the scope of the following claims.

The invention claimed is:

1. An integrated circuit, comprising:
a plurality of blocks, blocks in the plurality of blocks comprising a plurality of levels L(z), levels L(z) in the plurality of levels including respective two dimensional arrays of memory cells, respective two dimensional arrays including a plurality of horizontal lines and being intersected by a plurality of vertical lines coupled to corresponding memory cells in the array, wherein levels in the plurality of levels in a given block in the plurality of blocks include corresponding contact pads in electrical communication with the plurality of horizontal lines for the given block;
a plurality of global lines overlying the plurality of blocks, global lines in the plurality of global lines including a plurality of connectors, connectors in the plurality of connectors coupled to given global lines being coupled to landing areas on corresponding contact pads of the plurality of blocks; and
wherein the plurality of blocks include first and second blocks disposed so that a first set of the contact pads associated with the first block are next to a second set of contact pads associated with the second block, the landing areas of the contact pads of the first block, and the landing areas of the contact pads of the second block being mirror image surfaces of one another.

2. The integrated circuit of claim 1, wherein the plurality of horizontal lines are bit lines and the plurality of vertical lines are word lines.

3. The integrated circuit of claim 1, wherein:
there are N levels L(z) (level index z=1 to N) in each of the plurality of blocks;
the connectors are arranged for global lines in the plurality of global lines such that the level indexes for the levels L(z) of the first set of contact pads associated with the first block change in a stepped fashion toward the corresponding contact pads in the second set of contact pads from a first level to a second level; and
the level indexes for the levels L(z) of the second set of contact pads associated with the second block change in a stepped fashion toward the corresponding contact pads in the first set of contact pads from the first level to the second level.

4. The integrated circuit of claim 3, wherein the connectors contacting the contact pads at the first level for each of the first and second blocks are adjacent to one another with no other connectors therebetween.

5. The integrated circuit of claim 1 wherein the first and second sets of contact pads are in a generally V-shaped arrangement.

6. The integrated circuit of claim 1, wherein said arrays comprise NAND arrays, and the horizontal lines comprise local bit lines.

7. A 3-D structure comprising:
   a substrate;
   first and second units of alternating levels of insulating layers and active layers over the substrate;
   the first unit comprising active layers 1 through n with active layer 1 of the first unit being at a chosen level;
   the second unit comprising active layers 1 through n with active layer 1 of the second unit being at said chosen level;
   each of the first and second units including a stair step arrangement of landing regions on active layers;
   the landing regions of the first and second units being mirror image surfaces of one another;
   an insulating layer over the landing regions; and
   interlayer conductors passing through the insulating layer to the stairstep arrangements of landing regions for the first and second units to make electrical contact with a plurality of landing regions of each unit.

8. The 3-D structure according to claim 7, further comprising:
   a plurality of blocks, blocks in the plurality of blocks comprising a plurality of levels L(z) corresponding to active layers 1 through n, levels L(z) in the plurality of levels including respective two dimensional arrays of memory cells, respective two dimensional arrays including a plurality of horizontal lines, the plurality of horizontal lines being a chosen one of bit lines or word lines, and being intersected by a plurality of vertical lines coupled to corresponding memory cells in the array, the plurality of vertical lines being the non-chosen one of the bit lines or word lines, wherein levels in the plurality of levels are connected to said landing regions of the corresponding active layers so that the landing regions are in electrical communication with the plurality of horizontal lines for a given block.

9. The 3-D structure according to claim 7, further comprising insulating sleeves separating the interlayer conductors from the insulating layer.

10. The 3-D structure according to claim 7, wherein interlayer conductors make electrical contact with each of the landing regions of each unit.

11. The 3-D structure according to claim 7, wherein the mirror image surfaces create a generally V-shaped surface.

12. The 3-D structure according to claim 11, wherein the interlayer conductors contacting the landing regions of the first and second units being opposite one another with no other interlayer conductors therebetween.

13. The 3-D structure according to claim 12, wherein the mirror image surfaces create an inverted, generally V-shaped surface.

14. The 3-D structure according to claim 13, the interlayer conductors contacting the landing regions of the first and second units being opposite one another with no other interlayer conductors therebetween.

15. A 3-D structure comprising:
   a substrate;
   first and second units of alternating levels of insulating layers and active layers over the substrate;
   the first unit comprising active layers 1 through n with active layer 1 of the first unit being at a chosen level, n being a positive integer greater than 3;
   the second unit comprising active layers 1 through m with active layer 1 of the second unit being at said chosen level, m being a positive integer less than or equal to n;
   each of the first and second units including a stair step arrangement of landing regions on active layers and side surfaces extending from the landing regions;
   the landing regions and the side surfaces of the first and second units being mirror image surfaces of one another for active layers 1-$m$;
   an etch stop layer over the landing regions and side surfaces of the first and second units creating etch stop sidewalls along the side surfaces;
   an insulating layer over the etch stop layer;
   a plurality of blocks, blocks in the plurality of blocks comprising a plurality of levels L(z) corresponding to active layers 1 through n, levels L(z) in the plurality of levels including respective two dimensional arrays of memory cells, respective two dimensional arrays including a plurality of horizontal lines, the plurality of horizontal lines being a chosen one of bit lines or word lines, and being intersected by a plurality of vertical lines coupled to corresponding memory cells in the array, the plurality of vertical lines being the non-chosen one of the bit lines or word lines, wherein levels in the plurality of levels are connected to said landing regions of the corresponding active layers so that the landing regions are in electrical communication with the plurality of horizontal lines for a given block; and
   interlayer conductors passing through the insulating layer and the etch stop layer to the stairstep arrangements of landing regions for the first and second units to make electrical contact with a plurality of landing regions of each unit.

16. The 3-D structure according to claim 15, wherein m=n.

17. The 3-D structure according to claim 15, further comprising insulating sleeves separating the interlayer conductors from the insulating layer and the etch stop layer.

18. The 3-D structure according to claim 15, wherein interlayer conductors make electrical contact with each of the landing regions of each unit.

19. The 3-D structure according to claim 15, wherein the mirror image surfaces create a generally V-shaped surface.

20. The 3-D structure according to claim 19, wherein the interlayer conductors contacting the landing regions of the first and second units being opposite one another with no other interlayer conductors therebetween.

* * * * *